United States Patent
Davis et al.

(10) Patent No.: US 9,313,923 B2
(45) Date of Patent: Apr. 12, 2016

(54) MULTI-COMPONENT HEATSINK WITH SELF-ADJUSTING PIN FINS

(71) Applicant: Lenovo Enterprise Solutions (Singapore) Pte. Ltd., Singapore (SG)

(72) Inventors: Alvin G. Davis, Durham, NC (US); William M. Megarity, Raleigh, NC (US); April E. Ruggles, Durham, NC (US); Paul A. Wormsbecher, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 139 days.

(21) Appl. No.: 14/271,586

(22) Filed: May 7, 2014

(65) Prior Publication Data

US 2015/0327394 A1    Nov. 12, 2015

(51) Int. Cl.
| | |
|---|---|
| *G06F 1/20* | (2006.01) |
| *H05K 7/00* | (2006.01) |
| *H05K 7/20* | (2006.01) |
| *F28F 21/08* | (2006.01) |

(Continued)

(52) U.S. Cl.
CPC .............. *H05K 7/2039* (2013.01); *F28F 13/00* (2013.01); *F28F 21/084* (2013.01); *F28F 21/085* (2013.01); *H05K 1/0203* (2013.01); *F28F 2215/00* (2013.01); *F28F 2250/00* (2013.01); *H05K 2201/066* (2013.01)

(58) Field of Classification Search
CPC ................................ G06F 1/20; H05K 7/1053
USPC ......... 361/720, 721, 717, 718, 719, 709, 703, 361/710; 165/9.3, 104.34
See application file for complete search history.

(56) References Cited

U.S. PATENT DOCUMENTS

| | | | |
|---|---|---|---|
| 5,168,348 A | | 12/1992 | Chu et al. |
| 6,061,235 A | * | 5/2000 | Cromwell ........... H01L 23/3675 165/80.3 |

(Continued)

FOREIGN PATENT DOCUMENTS

| | | |
|---|---|---|
| EP | 0167033 A2 | 1/1986 |
| EP | 0369115 B1 | 5/1990 |
| EP | 0523387 A2 | 1/1993 |

OTHER PUBLICATIONS

S. Oktay et al, "A Conduction-Cooled Module for High-Performance LSI Devices" IBM Journal of Research and Development, vol. 26(1), pp. 55-66, Jan. 1982.

(Continued)

*Primary Examiner* — Anthony Haughton
(74) *Attorney, Agent, or Firm* — Katherine S. Brown; Jeffrey L. Streets

(57) ABSTRACT

A heatsink includes a rigid plate and a plurality of pin fins. The plate has a two dimensional array of holes through the rigid plate from a first face to a second face. Each pin fin is received in one of the holes and has a proximal end extending beyond the first face of the plate for conductively receiving heat, a distal end extending beyond the second face of the plate for convective heat exchange with air, a biasing member biasing the pin fin in a proximal direction, and a shoulder limiting the proximal extension of the pin fin through the hole. An apparatus may include the pin fin heatsink secured to a printed circuit board having at least two components that have different heights. Accordingly, each component is contacted by the proximal end of one or more self-adjusting pin fins that are aligned with the component.

19 Claims, 7 Drawing Sheets

(51) Int. Cl.
*F28F 13/00* (2006.01)
*H05K 1/02* (2006.01)

(56) References Cited

U.S. PATENT DOCUMENTS

| | | | | |
|---|---|---|---|---|
| 6,400,577 | B1* | 6/2002 | Goodwin | H05K 7/1084 174/368 |
| 6,545,879 | B1* | 4/2003 | Goodwin | H05K 7/1053 361/688 |
| 6,657,131 | B2* | 12/2003 | Gonzalez | H01L 23/32 174/250 |
| 7,209,354 | B2* | 4/2007 | Wu | H01L 23/4093 257/706 |
| 7,391,617 | B2* | 6/2008 | Veh | G06F 1/20 165/104.33 |
| 7,443,686 | B2* | 10/2008 | Kuo | G06F 1/182 257/E23.084 |
| 7,576,989 | B2* | 8/2009 | Li | H01L 23/4093 165/185 |
| 7,606,032 | B2* | 10/2009 | Lin | F16B 41/002 361/704 |
| 7,729,122 | B2* | 6/2010 | Wong | H01L 23/4093 361/679.54 |
| 7,869,217 | B2* | 1/2011 | Chen | H01L 23/4093 165/80.2 |
| 7,870,888 | B2* | 1/2011 | Zhou | H01L 23/4006 165/80.3 |
| 8,238,103 | B2* | 8/2012 | Urai | H01L 23/40 165/80.2 |
| 8,520,393 | B2* | 8/2013 | Homer | G06F 1/20 165/122 |
| 8,625,278 | B2* | 1/2014 | Wang | G06F 1/20 165/104.33 |
| 2002/0030972 | A1* | 3/2002 | Ali | H01L 23/4006 361/704 |
| 2004/0057212 | A1 | 3/2004 | Russell et al. | |
| 2009/0213541 | A1 | 8/2009 | Butterbaugh et al. | |
| 2013/0050951 | A1* | 2/2013 | Zhou | G06F 1/20 361/720 |
| 2013/0199767 | A1 | 8/2013 | Karidis et al. | |

OTHER PUBLICATIONS

A. E. Bergles, "Evolution of Cooling Technology for Electrical, Electronic, and Microelectronic Equipment" IEEE Transactions on Components and Packaging Technologies, vol. 26(1), pp. 6-15, Mar. 2003.

\* cited by examiner

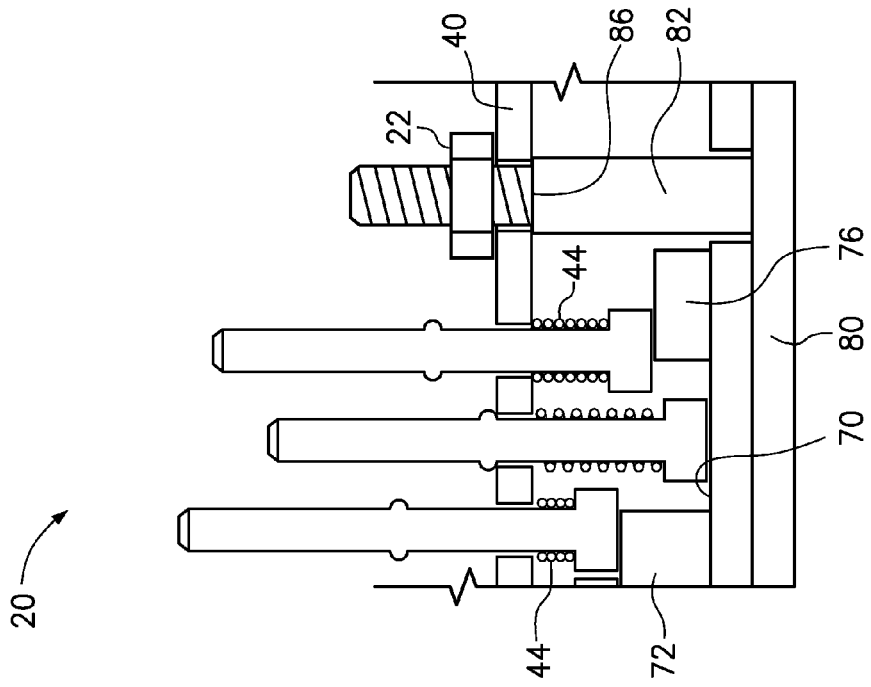
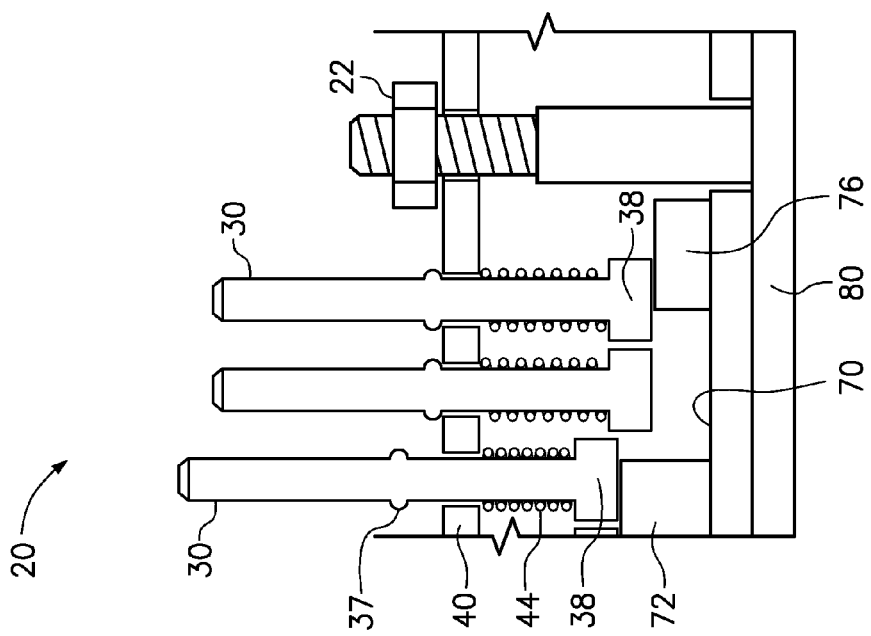
FIG. 3D
FIG. 3C

MULTI-COMPONENT HEATSINK WITH SELF-ADJUSTING PIN FINS

BACKGROUND

1. Field of the Invention

The present invention relates to a heat sink for removing heat from multiple heat-generating electronic components on a planar.

2. Background of the Related Art

Computer systems require removal of heat from heat-generating electronic components such as processors. Heat-generating electronic components are often coupled to a generally planar circuit board having a series of electronic connectors along an edge of the circuit board to facilitate electronic engagement between the circuit board and a motherboard. Electrical current and data are routed to and from the heat-generating electronic component through the motherboard and the electronic connectors of the circuit board. Heat generated by the electronic component may be transferred by conduction to a heat sink having a plurality of fins, pins or other high surface area structure coupled to the heat sink to dissipate heat to air flowing through a computer chassis housing the circuit board. One or more air movers, such as fans, may be used to move air through the computer chassis so that the air will flow across the fins to enhance dissipation of heat from the heat sink. Air movers are fixed relative to the computer chassis to draw air into one end of the chassis, across components disposed within the chassis, and then through the air movers to exit the chassis.

Electronic components are generally coupled to a circuit board in an arrangement that saves space and promotes compactness of the computer. Furthermore, an expansion card may be disposed horizontally or vertically with respect to the motherboard within a chassis as needed to utilize available space given the form factor of the chassis. Similarly, the electronic components may be oriented and positioned in a manner that provides the most efficient layout of the components on the expansion card. A heat sink may be disposed on an electronic component to conduct heat generated by the electronic component through the heat sink to a plurality of air-cooled fins to remove heat from the electronic component by dissipation to surrounding air flow.

BRIEF SUMMARY

One embodiment of the present invention provides a heatsink, comprising a rigid plate and a plurality of pin fins. The rigid plate has a two dimensional array of holes through the rigid plate from a first face of the plate to a second face of the rigid plate. Each pin fin is received in one of the holes and has a proximal end extending beyond the first face of the rigid plate for conductively receiving heat, a distal end extending beyond the second face of the rigid plate for convective heat exchange with air, a biasing member biasing the pin fin in a proximal direction, and a shoulder limiting the proximal extension of the pin fin through the hole.

Another embodiment of the present invention provides an apparatus, comprising a pin fin heatsink secured to a printed circuit board. The printed circuit board has a first surface securing a plurality of components, wherein at least two of the components have different heights above the surface of the printed circuit board. The pin fin heatsink includes a rigid plate and a plurality of pin fins, wherein the rigid plate has a two dimensional array of holes through the rigid plate from a first face of the rigid plate to a second face of the plate rigid. Each pin fin is received in one of the holes and has a proximal end extending beyond the first face of the rigid plate, a distal end extending beyond the second face of the rigid plate for convective heat exchange with air, a biasing member biasing the pin fin in a proximal direction into contact with one of the components, and a shoulder limiting the proximal extension of the pin fin through the hole. The rigid plate is secured to the printed circuit board so that each component is contacted by the proximal end of one or more pin fins that are aligned with the component.

BRIEF DESCRIPTION OF THE SEVERAL VIEWS OF THE DRAWINGS

FIGS. 3A-3D are a series of side view illustrating how individual pin fins self-adjust as the pin fin heatsink is secured to the printed circuit board.

DETAILED DESCRIPTION

Figure 1:
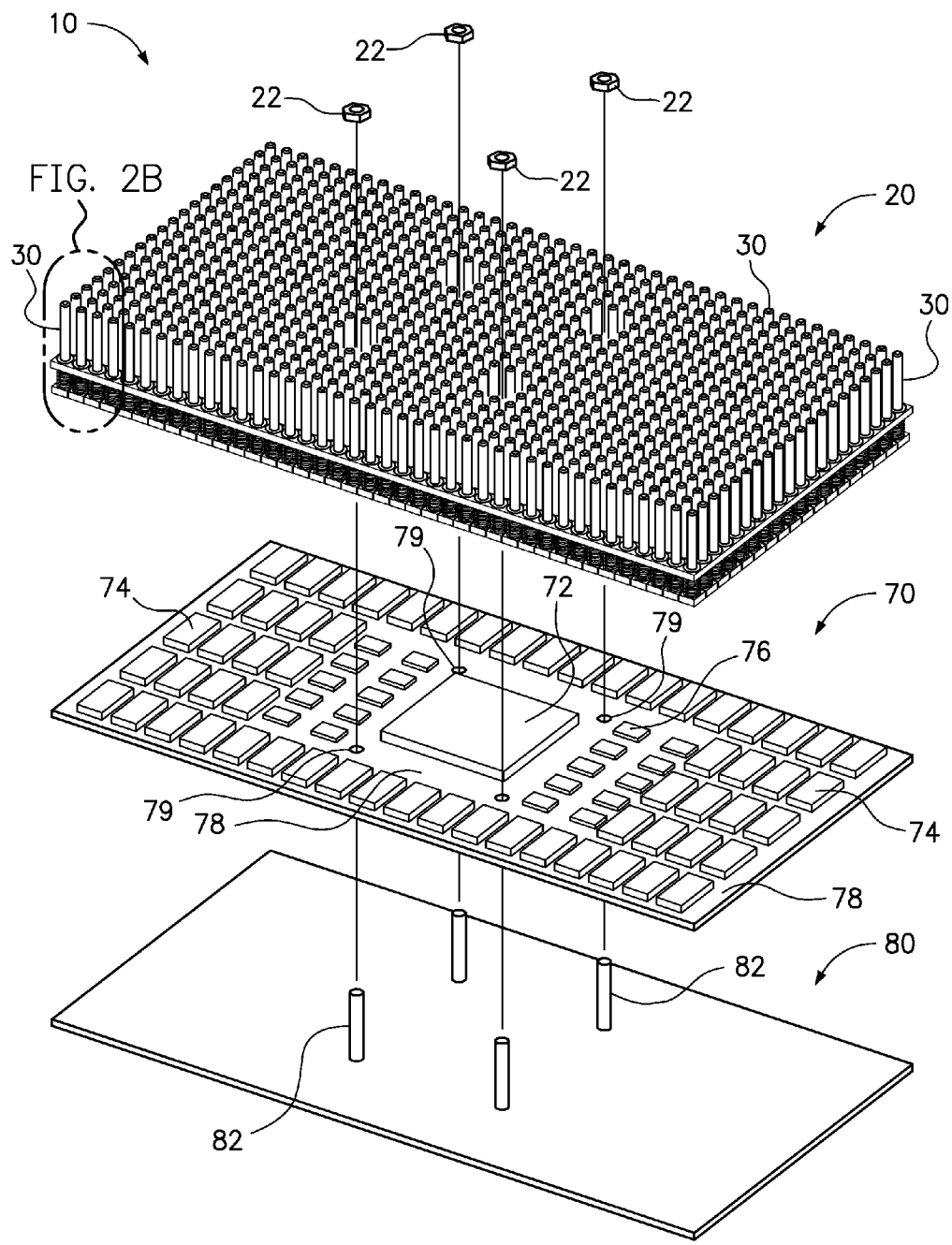
FIG. 1 is an exploded perspective view of a pin fin heatsink of the present invention aligned for securing to a printed circuit board.

One embodiment of the present invention provides a heatsink, comprising a rigid plate and a plurality of pin fins. The rigid plate has a two dimensional array of holes through the rigid plate from a first face of the plate to a second face of the plate. Each pin fin is received in one of the holes and has a proximal end extending beyond the first face of the plate for conductively receiving heat, a distal end extending beyond the second face of the plate for convective heat exchange with air, a biasing member biasing the pin fin in a proximal direction, and a shoulder limiting the proximal extension of the pin fin through the hole.

The heatsink is preferably securable to a printed circuit board having a plurality of heat-generating electronic components, wherein the plurality of heat-generating components do not all have the same height above the printed circuit board. Due to the components having different elevations above the surface of the printed circuit board, a heatsink with a flat base will not make efficient thermal contact with each of the components. The individual self-adjusting pin fins of the heatsink in accordance with the present invention make efficient thermal contact with multiple components of varying heights. For example, the plurality of heat-generating electronic components may be selected from processors, memory chips, voltage regulator-down (VRD) chips, and combinations thereof.

The rigid plate may be planar or have planar regions, but is not required to be entirely planar. Rather, the rigid plate may have regions with different elevations or thicknesses. The rigid plate has sufficient thickness that the side of the holes through the rigid plate will keep the pin fins in a desired orientation (i.e., prevent tilting such that adjacent pin fins or their pads interfere with each other). Furthermore, the rigidity of the plate may allow for small amounts of flexing, but should be able to withstand compression of the biasing members without bowing to the extent that there is a loss of efficient thermal contact between the pin fins and the heat-generating components. Even if thermal interface materials are used between the pin fins and heat-generating components, a more precise surface-to-surface contact allows for better heat transfer and the use of superior thermal interface materials.

The rigid plate may optionally have at least two regions that are thermally insulated to reduce heat transfer from one region to another. However, within a region, the rigid plate is preferably thermally conductive in order to transfer heat laterally between the pin fins within that region. In one example, the pin fins that extend through one of the regions may be aligned for contact with a processor. Since a processor typically will produce more heat than a memory module or other components, it may be desirable to prevent the processor heat from being conducted through the rigid plate to an adjacent component.

The two dimensional array of holes through the rigid plate may take the form of uniform row and columns, or some alternative layout. Preferably, an alternative layout may be customized to reflect the layout or heat load of components on a printed circuit board with which the pin fin heatsink is to be used. In a non-limiting example, the rigid plate may include a first region having a plurality of holes in a first layout, and a second region having a plurality of holes in a second layout, wherein the first layout is different than the second layout.

The plurality of pin fins may all be the same or include a variety of shapes, sizes, and materials. In a first non-limiting example, the plurality of pin fins may include a first group of pin fins made from a first thermally conductive material, such as copper or a copper alloy, and a second group of pin fins made from a second thermally conductive material, such as aluminum. In a second non-limiting example, the rigid plate may include a first region having a plurality of pin fins with a first cross-sectional dimension, and a second region having a plurality of pin fins with a second cross-sectional dimension, wherein the first cross-sectional dimension is different than the second cross-sectional dimension. The cross-sectional dimensions may be diameters or major axis of noncircular cross-sections.

The biasing member may be made with any known biasing materials and configurations. A preferred biasing member is a compression spring, which may be made with metal or plastic. Alternative configurations may use wave springs, tension springs, flexible foams and the like. In a non-limiting embodiment, the rigid plate may include a first region where each of the pin fins has a first biasing member, and a second region where each of the pin fins has a second biasing member, wherein the first biasing member has a spring constant that is different than a spring constant of the second biasing member.

In another embodiment, the proximal end of the pin fin forms a pad having a contact surface that is larger than the cross-section of the pin fin. The larger contact surface may increase the amount of heat transfer between the component and the pin fin. Furthermore, the including of a pad at the proximal end of the pin fin may facilitate the use of a compression spring disposed about the pin fin between the pad and the rigid plate. In a non-limiting example, the contact surface of the pad is rectangular. Optionally, the holes, and a central portion of the pin fins that extends through the holes, are shaped to prevent rotation of the pin fins within the holes.

Another embodiment of the present invention provides an apparatus, comprising a pin fin heatsink secured to a printed circuit board. The printed circuit board has a first surface securing a plurality of components, wherein at least two of the components have different heights above the surface of the printed circuit board. The pin fin heatsink includes a rigid plate and a plurality of pin fins, wherein the rigid plate has a two dimensional array of holes through the plate from a first face of the plate to a second face of the plate. Each pin fin is received in one of the holes and has a proximal end extending beyond the first face of the plate, a distal end extending beyond the second face of the plate for convective heat exchange with air, a biasing member biasing the pin fin in a proximal direction into contact with one of the components, and a shoulder limiting the proximal extension of the pin fin through the hole. The rigid plate is secured to the printed circuit board so that each component is contacted by the proximal end of one or more pin fins that are aligned with the component. The apparatus may further include or incorporate any of the features of the pin fin heatsink described herein.

The apparatus may further include a backing plate disposed along a second surface of the printed circuit board, and fasteners extending through the printed circuit board to secure the backing plate to the rigid plate. Preferably the rigid plate is secured a predetermined fixed distance above the surface of the printed circuit board, such as by including a spacer therebetween.

In a preferred apparatus, securing the pin fin heatsink to the printed circuit board with the proximal end of the pin fins in contact with components on the printed circuit board causes the pin fins to self-adjust the height of the pin fin above the rigid plate according to the relative height of the component contacting the proximal end of the pin fin.

In one non-limiting example of the apparatus, each biasing member is selected to provide a contact pressure that is specified for the component that is aligned for contact with a corresponding pin fin.

In another non-limiting example of the apparatus, the rigid plate may have a first region and a second region that are thermally insulated to reduce heat transfer between the first and second regions. Accordingly, pin fins in the first region of the rigid plate may be aligned for contact with a first component type on the printed circuit board and pin fins in the second region of the rigid plate area may be aligned for contact with a second component type, wherein the first component type produces more heat than the second component type. The thermally insulated regions prevent the higher temperatures of the first component type from affecting the second component type.

Heatsinks are often required to cool circuit board components that have varying heights. For example, one expansion card or motherboard may include a processor (CPU), several voltage regulator-down (VRD) chips, and several memory chips. All of these components have different installed heights. In addition, the VRDs often have large dimensional tolerances that must be accommodated (i.e., 1 mm+/−0.5 mm). Typically, this expansion card would require using distinct heatsinks for each of the different component types. In other words, the CPU would have its own heatsink, each VRD bank would have a heatsink, and the memory components would use yet another heatsink. However, a large number of screw holes in the card (printed circuit board) can weaken the card and lead to warping and other problems.

FIG. 1 is an exploded perspective view of an apparatus 10 including a pin fin heatsink 20, in accordance with one embodiment of the present invention, aligned for securing to a printed circuit board 70 using a backing plate 80. The printed circuit board 70 may, for example, be a motherboard or an expansion card (edge connector not shown) and is shown having a processor 72, memory chips 74, and voltage regulator-down chips 76. These three component types are shown having three different heights or elevations above the first surface 78 of the board 70.

The pin fin heatsink 20 is aligned above the board 70 so that the heatsink covers all of the components 72, 74, 76 that are to be cooling with the heatsink. The desired alignment may be guided by a set of fasteners, such as posts 82 extending from the backing plate 80. The posts 82 extend through holes 79 in the board 70 and holes in the heatsink 20 (see FIGS. 5 and 3A-3D). In one example, the posts 82 may include threaded ends for coupling with a set of threaded nuts 22.

When the pin fin heatsink 20 is lowered onto the board 70 and secured, individual pin fins 30 self-adjust their height in response to contact with the components 72, 74, 76. When all of the pin fins have the same dimensions as shown, then the pin fins that are aligned with the tallest component (such as the processor 72) will be pushed in a distal direction (upward) the farthest. The pin fins that are aligned with the intermediate height components (such as the memory chips 74) will be pushed in a distal direction (upward) an intermediate distance, and the pin fins that are aligned with the shortest components (such as the VRDs 776) will be pushed in a distal direction (upward) a short distance. There may be pin fins that will not be aligned with any component, such that they may not contact any component. A more detailed discussion of the individual pin fins will follow.

Figures 2A, 2B:
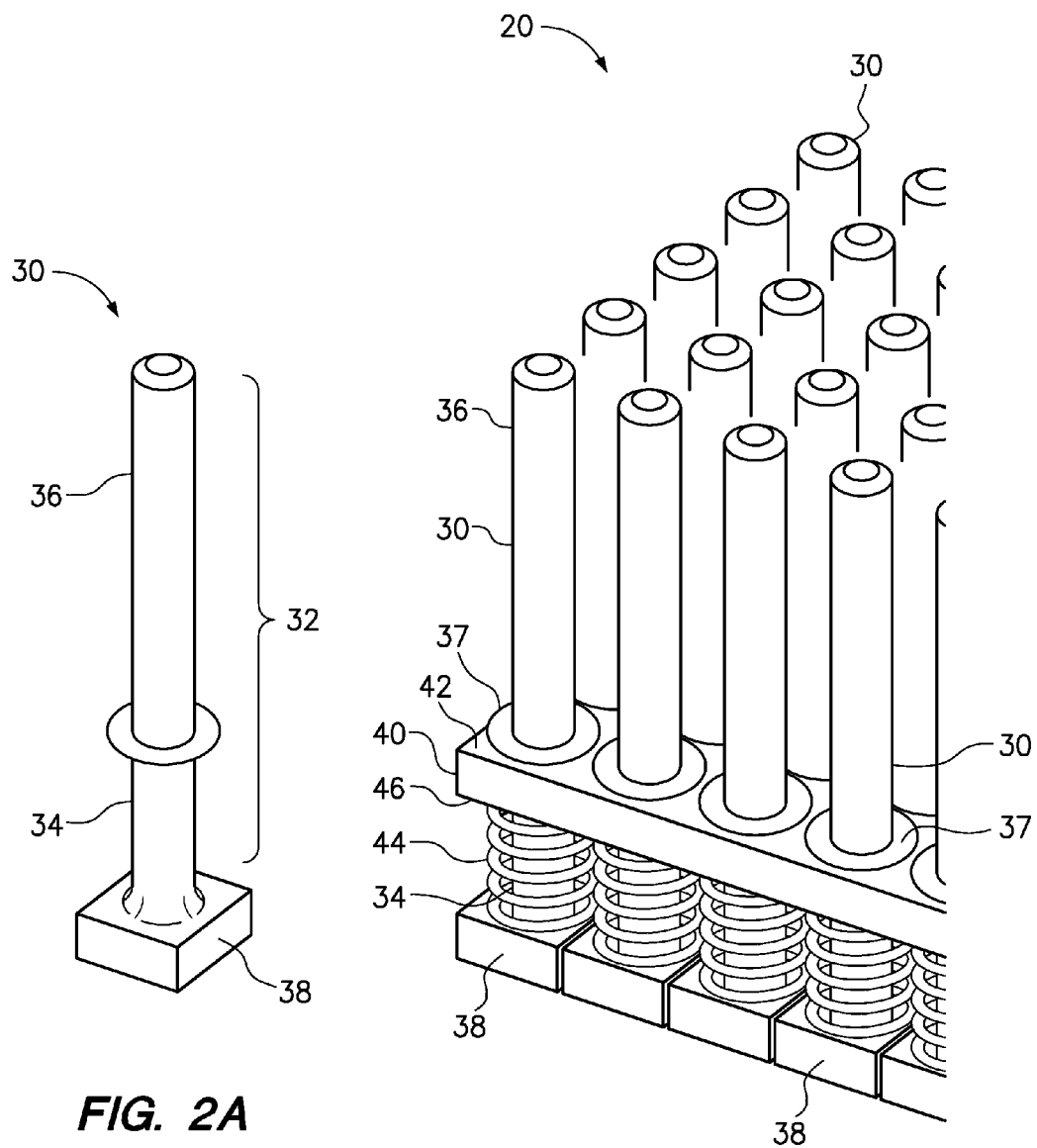
FIG. 2A is a perspective view of an individual pin fin.
FIG. 2B is a perspective view of a corner of the pin fin heatsink of FIG. 1.

FIG. 2A is a perspective view of an individual pin fin 30. The pin fin includes a main pin body 32, having a proximal end 34 and a distal end 36. The terms "proximal" and "distal" are used in reference to the printed circuit board, such that the proximal end 34 is directed toward the printed circuit board and the distal end 36 is directed away from the printed circuit board. A shoulder 37 is provided intermediate of the proximal and distal ends and is used to limit the proximal extension of the pin fin, as discussed more below. The proximal end 34 preferably includes a pad 38 for contacting a component on the printed circuit board.

FIG. 2B is a perspective view of a corner section of the pin fin heatsink 20 of FIG. 1. Each pin fin 30 is made consistent with the pin fin shown in FIG. 2A. However, the pin fin extends through a hole in a rigid plate (carrier plate) 40 with the shoulder 37 adjacent distal side 42 of the plate 40. During assembly, a compression spring 44 has been positioned around the proximal end 34 of the pin fin 30 between the rigid plate 40 and the pad 38. Accordingly, the compression spring 44 is captured between the rigid plate 40 and the pad 38, and has biased the pin fin 30 in a proximal direction until the shoulder 37 engages the side 42 of the rigid plate 40. Note that the distance between a lower surface 46 of the rigid plate 40 and a top surface of the pad 38 must be enough to accommodate the spring. Furthermore, this distance not only accommodates the spring, but may allow the pin fin to have a range of movement that is sufficient to contact components having an expected range of heights.

Figures 3A, 3B:
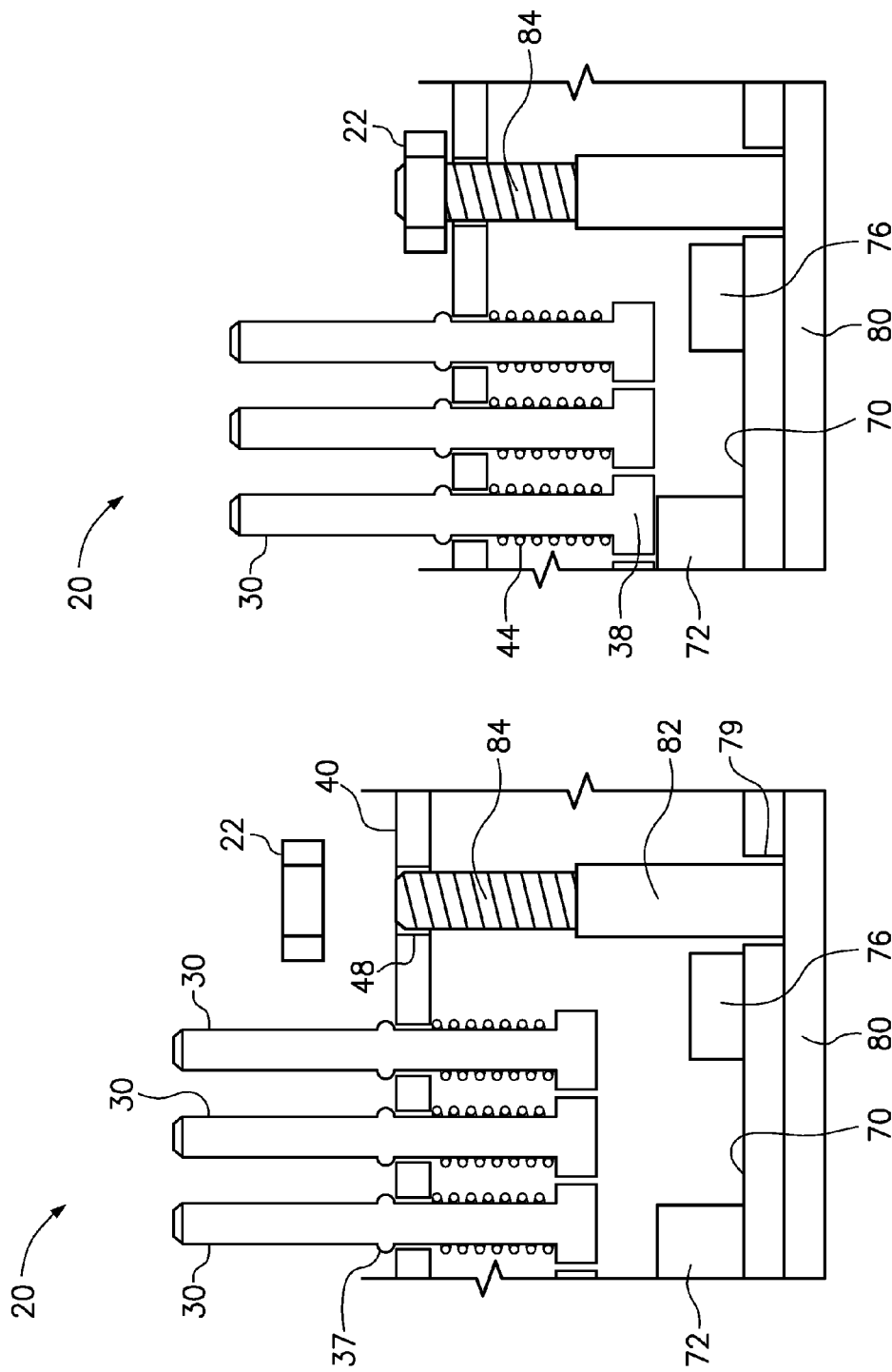

FIGS. 3A-3D are a series of side view illustrating how individual pin fins 30 self-adjust as the pin fin heatsink 20 is secured to the printed circuit board 70. More specifically, as shown in FIG. 3A, a backing plate 80 is disposed along one side of the board 70 and has posts 82 that extend through holes in the board 70. The posts 82 (only one shown in FIG. 3A) also extend through an equal number of holes 48 through the rigid plate 40 to align the heatsink 20 over the board 70. Although other fasteners may be envisioned and used, the embodiment shown has screw threads 84 formed on a distal end of each post 82 for threadably coupling with one of the nuts 22. In the position shown in FIG. 3A, the heatsink 20 is still be lowered toward the board 70, such that none of the pads 38 at the proximal ends of the pin fins 30 have yet contacted any of the components 72, 76 on the board 70.

In FIG. 3B, the heatsink 20 has been lowered the board 70 so that the pad 38 of one of the pin fins 30 (the left-most pin fin) has made initial contact with the tallest component (processor 72). However, none of the compression springs 44 have yet been compressed and none of the pin fins 30 have self-adjusted to the height of the components. Notice that the nut 22 has now engaged the threads 84 of the post.

In FIG. 3C, the heatsink 20 has been lowered further toward the board 70 so that the pad 38 of one of the pin fins 30 (the right-most pin fin) has made initial contact with the shorter component (VRD 76). The left-most pin fin is still in contact with the processor 72, but the respective compression spring 44 has been partially compressed and the pin fin 30 has self-adjusted in a distal direction. Accordingly, the left-most pin fin now extends distally above the other pin fins 30 and the shoulder 37 has been lifted above the rigid plate 40. The position of the heatsink 20 in FIG. 3C may be achieved by pushing the rigid plate 40 toward the board 70, such as by advancing the nut 22 on the threads of the post.

In FIG. 3D, the heatsink 20 has been lowered still further toward the board 70 to reach a preferred operative position. As shown, the nut 22 has been advanced further and secures the rigid plate 40 between the nut 22 and a shoulder 86 on the post 82. The right-most pin fin 30 has self-adjusted and the left-most pin fin has further self-adjusted. Accordingly, the right-most pin fin extends distally above the middle pin fin, and left-most pin fin still extends above the right-most pin fin. It is not important for the middle pin fin to contact the board 70. However, if the middle pin fin had been aligned with a component even shorter than the VRD 76, then it would have made thermal contact with that component.

Figure 4:
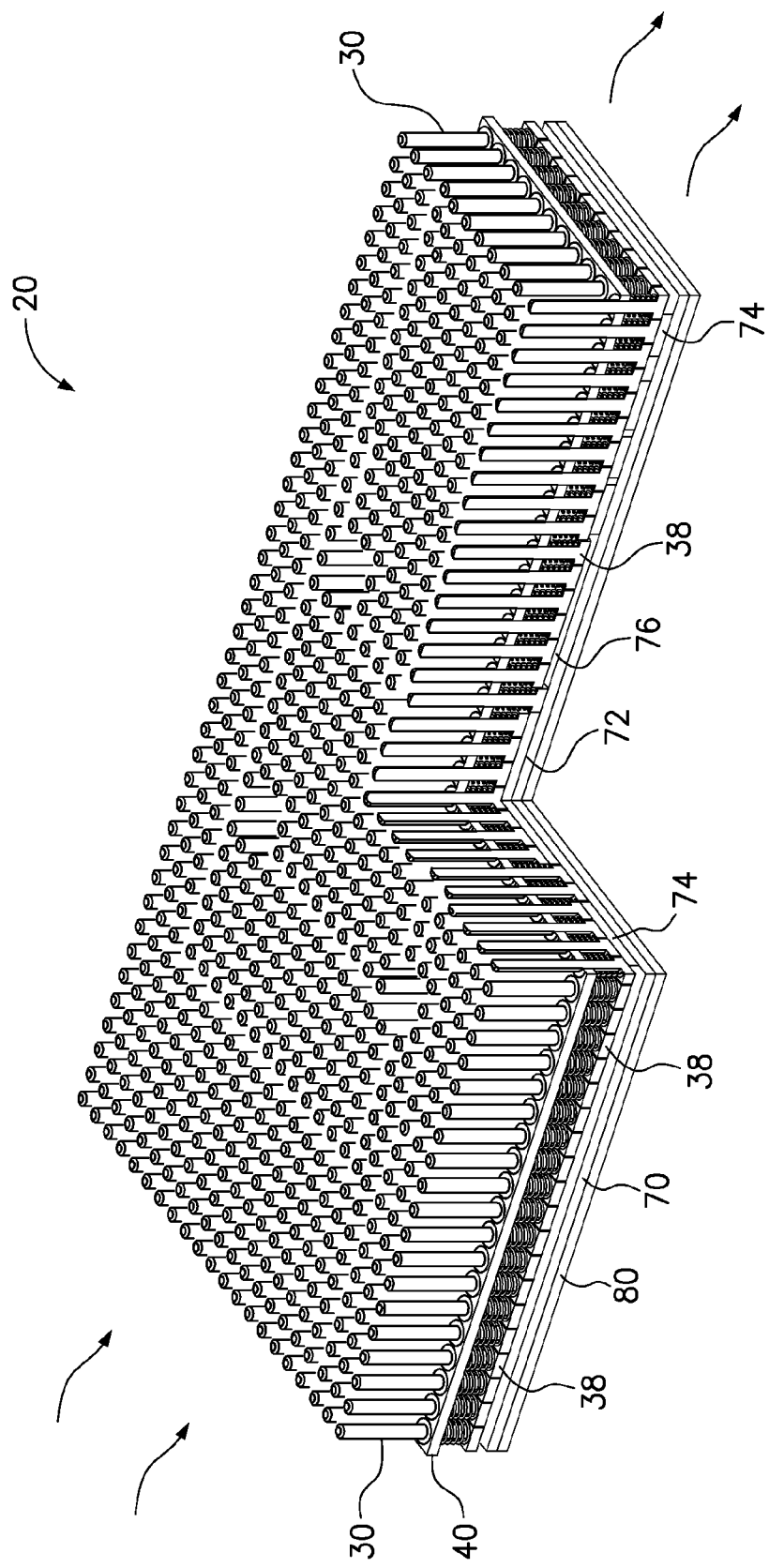
FIG. 4 is a partial cross-sectional perspective view of the pin fin heatsink secured to a printed circuit board.

FIG. 4 is a partial cross-sectional perspective view of the pin fin heatsink 20 secured to a printed circuit board 70 consistent with FIG. 3D. The individual pin fins 30 have self-adjusted in response to contact with the various components 72, 74, 76 on the board 70. Although not required, all of the pin fins 30 in this embodiment of the heatsink 20 are the same size and shape, and follow a layout of evenly spaced rows and column.

During use, heat generated by the various components 72, 74, 76 is conductively transferred to any of the pin fins 30 that are in contact with the components. A thermal interface material may be disposed between the pads 38 and the components as well. The heat is conducted through the pin fin 30 and is removed by airflow passing through the pin fins, such as airflow established by a fan (now shown). The airflow may be effective in any lateral direction, such as left-to-right, right-to-left, front-to-back, back-to-front, and at any angle relative to the heatsink.

Figure 5:
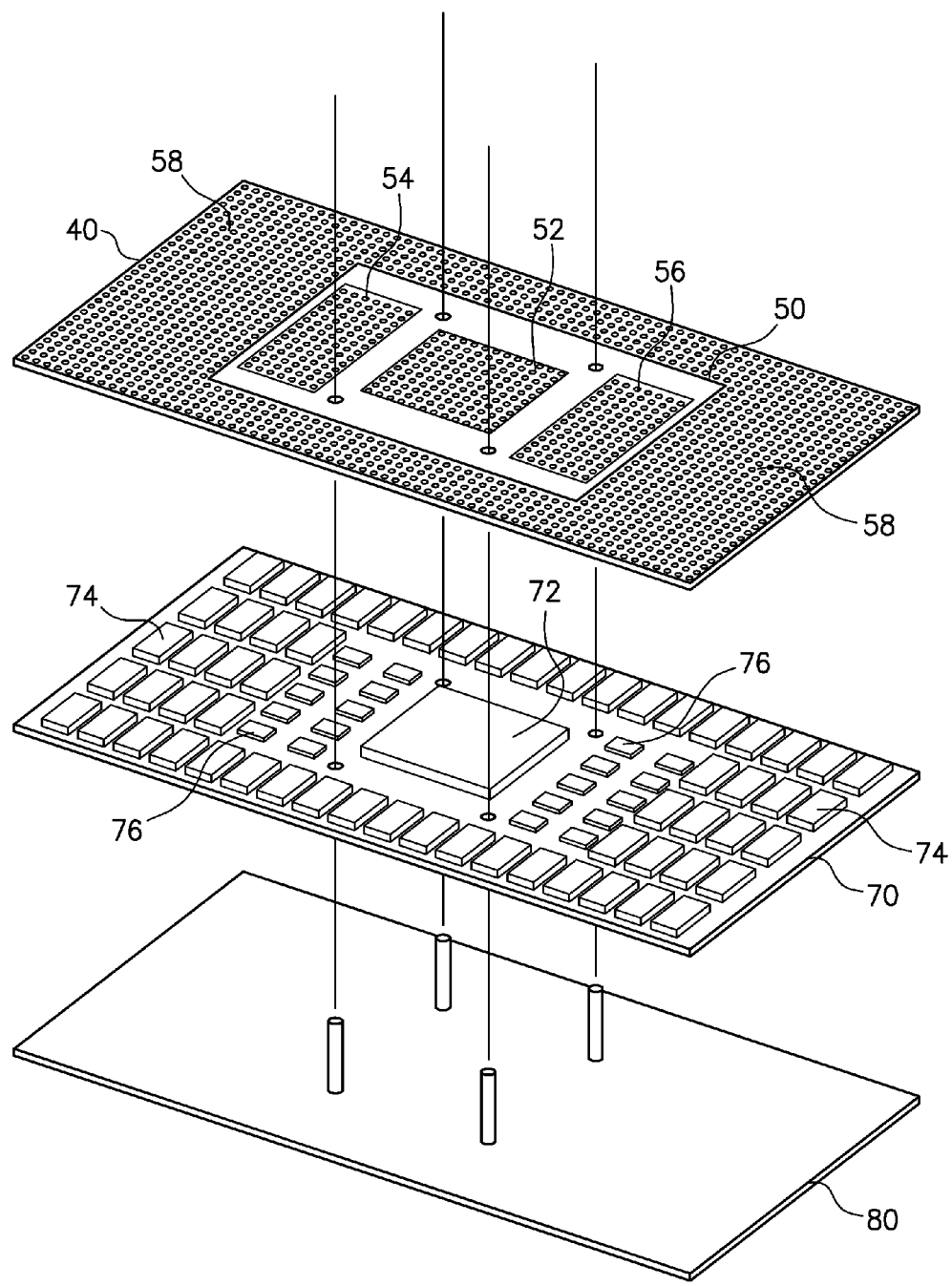
FIG. 5 is an exploded perspective view of a pin fin heatsink with the pin fins removed to show a main body of the heatsink having regions that are thermally insulated from adjacent regions.

FIG. 5 is an exploded perspective view of the apparatus 10, but showing an embodiment of the rigid plate 40 with the pin fins 30 removed. In this embodiment, the rigid plate 40 has been divided into four regions that are thermally insulated from adjacent regions. As shown, a frame 50 thermally insulates a first region 52, second region 54, third region 56, and fourth region 58 from each other. Within each region, heat from a heat generating component is allowed to be conducted laterally through the region and from pin fin to pin fin. Accordingly, even a pin fin that does not directly contact a heat-generating component may be helpful in dissipating heat by virtue of its contact with that region of the plate. However, the thermally insulating frame 50 prevents or reduces heat transfer between regions, such that the high temperatures of components in one region do not effect the cooling of components in another region. In a preferred configuration, each region might only contact and cool components of a single component type. As shown, the first region 52 is aligned with the processor 72, the second region 54 is aligned with one set of VRDs 76, the third region 56 is aligned with another set of VRDs 76, and the fourth region 58 is aligned with all of the memory chips 74.

Figure 6:
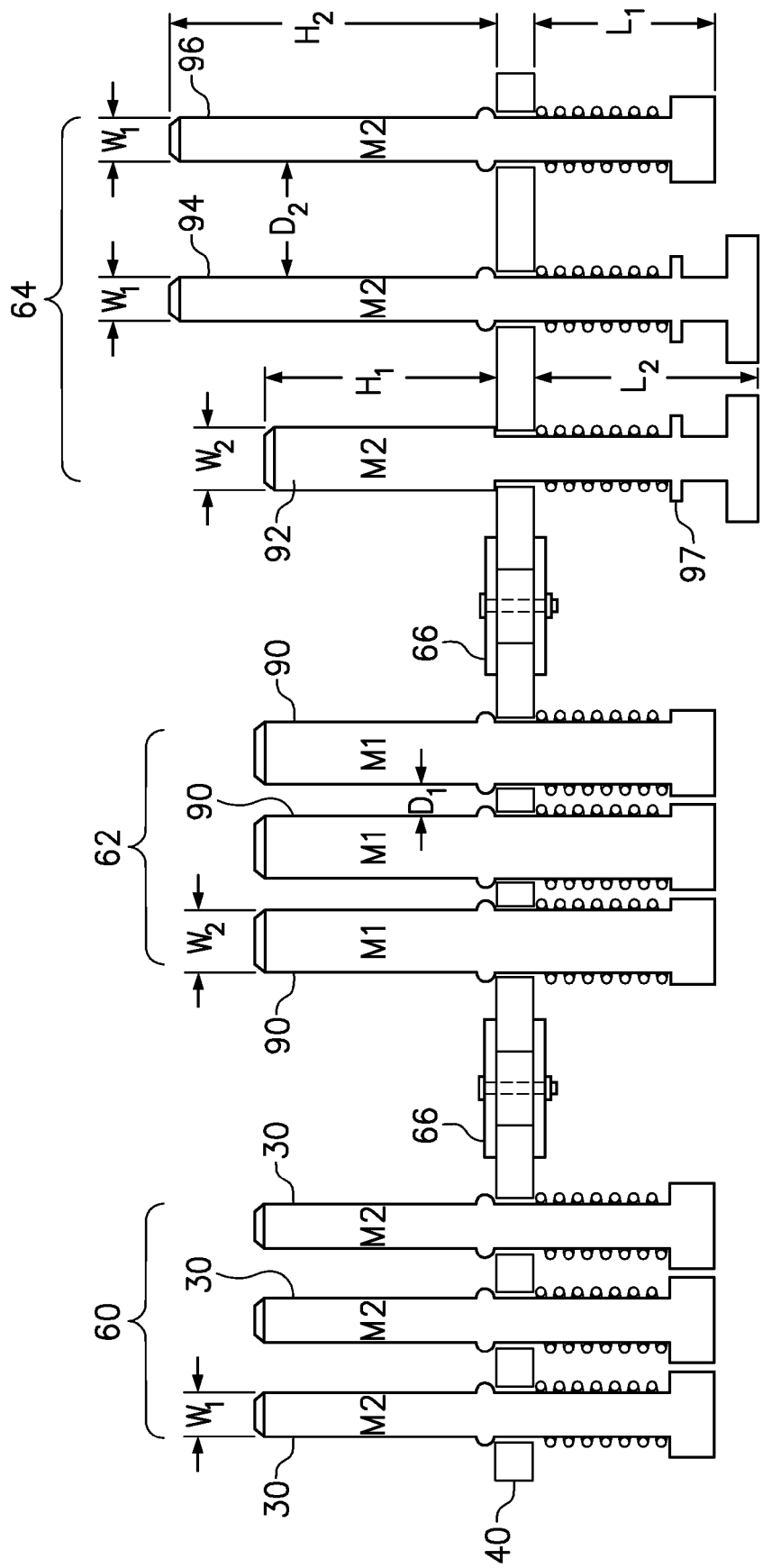
FIG. 6 is a schematic cross-sectional view illustrating various sizes of pin fins.

FIG. 6 is a schematic cross-sectional view illustrating pin fins having various sizes, shapes and materials. In this schematic, a rigid plate 40 has been divided into three regions 60, 62, 64 that are thermally insulated from each other by plastic frame members 66. In the first region 60, the pin fins 30 are all identical in length, cross-section and material (a metal, M2). In the second region 62, the pin fins 90 are all the same length, cross-section and material (a metal, M1), but the cross-sectional dimension W2 is different than the cross-sectional dimension W1 of the pin fins 30 and the metal M1 is different than the metal M2 of the pin fins 30.

In the third region 64, the pin fins 92, 94, 96 are all different shapes and sizes from each other and different than the pin fins 30, 90 in the other regions. Furthermore, the spacing between adjacent pin fins is a distance D2, which is greater than the distance D1 between pin fins 90. Pin fin 92 has a height H1 (above the rigid plate), a width W2, and a length L2 (below the rigid plate). Pin fin 94 has a height H2, a width W1, and a length L2. Pin fin 96 has a height H2, a width W1, and a length L1. Optionally, the pin fins 96 may use the same compression springs despite the difference in length by providing a separate shoulder 97. As can be seen, the various dimensions of each fin pin may be customized to provide the desired heat transfer and/or granularity of self-adjusting pin fins.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A heatsink, comprising:
a rigid plate having a two dimensional array of holes through the plate from a first face of the plate to a second face of the plate; and
a plurality of pin fins, each pin fin received in one of the holes and having a proximal end extending beyond the first face of the plate for conductively receiving heat, a distal end extending beyond the second face of the plate for convective heat exchange with air, a biasing member biasing the pin fin in a proximal direction, and a shoulder limiting the proximal extension of the pin fin through the hole.

2. The heatsink of claim 1, wherein the heatsink is securable to a printed circuit board having a plurality of heat-generating electronic components, wherein the plurality of heat-generating components do not all have the same height above the printed circuit board.

3. The heatsink of claim 1, wherein the plurality of heat-generating electronic components are selected from processors, memory chips, VRDs, and combinations thereof.

4. The heatsink of claim 1, wherein the plurality of pin fins includes a first group of pin fins made from a first thermally conductive material and a second group of pin fins made from a second thermally conductive material.

5. The heatsink of claim 4, wherein the first thermally conductive material is copper or a copper alloy, and wherein the second thermally conductive material is an aluminum alloy.

6. The heatsink of claim 1, wherein the rigid plate has at least two regions that are thermally insulated to reduce heat transfer from one region to another.

7. The heatsink of claim 6, wherein the pin fins extending through one of the regions are aligned for contact with a processor.

8. The heatsink of claim 1, wherein the rigid plate includes a first region where each of the pin fins has a first biasing member, wherein the rigid plate includes a second region where each of the pin fins has a second biasing member, and wherein the first biasing member has a spring constant that is different than a spring constant of the second biasing member.

9. The heatsink of claim 1, wherein the rigid plate includes a first region having a plurality of holes in a first layout, wherein the rigid plate includes a second region having a plurality of holes in a second layout, wherein the first layout is different than the second layout.

10. The heatsink of claim 1, wherein the rigid plate includes a first region having a plurality of pin fins with a first cross-sectional dimension, wherein the rigid plate includes a second region having a plurality of pin fins with a second cross-sectional dimension, wherein the first cross-sectional dimension is different than the second cross-sectional dimension.

11. The heatsink of claim 1, wherein the proximal end of the pin fin forms a pad having a contact surface that is larger than the cross-section of the pin fin.

12. The heatsink of claim 11, wherein the contact surface of the pad is rectangular, and wherein the holes and a central portion of the pin fins that extend through the holes are shaped to prevent rotation of the pin fins.

13. The heatsink of claim 11, wherein the biasing member is a compression spring disposed about the pin fin between the pad and the rigid plate.

14. An apparatus, comprising:
a printed circuit board having a first surface securing a plurality of components, wherein at least two of the components have different heights above the surface of the printed circuit board;
a pin fin heatsink including a rigid plate and a plurality of pin fins, wherein the rigid plate has a two dimensional array of holes through the plate from a first face of the plate to a second face of the plate, and wherein each pin fin is received in one of the holes and has a proximal end extending beyond the first face of the plate, a distal end extending beyond the second face of the plate for convective heat exchange with air, a biasing member biasing the pin fin in a proximal direction into contact with one of the components, and a shoulder limiting the proximal extension of the pin fin through the hole, wherein the rigid plate is secured to the printed circuit board so that each component is contacted by the proximal end of one or more pin fins that are aligned with the component.

15. The apparatus of claim 14, wherein each biasing member is selected to provide a contact pressure that is specified for the component that is aligned for contact with a corresponding pin fin.

16. The apparatus of claim 14, further comprising:
a backing plate disposed along a second surface of the printed circuit board; and
fasteners extending through the printed circuit board to secure the backing plate to the rigid plate.

17. The apparatus of claim 14, wherein securing the pin fin heatsink to the printed circuit board with the proximal end of the pin fins in contact with components on the printed circuit board causes the pin fins to self-adjust the height of the pin fin above the rigid plate according to the relative height of the component contacting the proximal end of the pin fin.

18. The apparatus of claim 14, wherein the rigid plate includes a first region having a plurality of holes in a first layout, wherein the rigid plate includes a second region having a plurality of holes in a second layout, wherein the first layout is different than the second layout.

19. The apparatus of claim 14, wherein the rigid plate has a first region and a second region that are thermally insulated to reduce heat transfer between the first and second regions, wherein pin fins in the first region of the rigid plate are aligned for contact with a first component type on the printed circuit board and pin fins in the second region of the rigid plate area aligned for contact with a second component type, and wherein the first component type produces more heat than the second component type.

* * * * *